US006998848B2

(12) United States Patent
Kereit

(10) Patent No.: US 6,998,848 B2
(45) Date of Patent: Feb. 14, 2006

(54) METHOD FOR PRODUCING A FAULT SIGNAL WHICH INDICATES A SHORT TO GROUND

(75) Inventor: Matthias Kereit, Berlin (DE)

(73) Assignee: Siemens Aktiengesellschaft, Munich (DE)

(*) Notice: Subject to any disclaimer, the term of this patent is extended or adjusted under 35 U.S.C. 154(b) by 24 days.

(21) Appl. No.: 10/367,334

(22) Filed: Feb. 14, 2003

(65) Prior Publication Data

US 2004/0085074 A1    May 6, 2004

(30) Foreign Application Priority Data

Oct. 30, 2002  (DE)  ................. 102 51 001

(51) Int. Cl.
G01R 31/14   (2006.01)
G01R 31/08   (2006.01)
H02H 3/00    (2006.01)
H02H 9/08    (2006.01)

(52) U.S. Cl. .................. 324/509; 324/522; 361/42
(58) Field of Classification Search ................ 324/509, 324/522, 107, 108, 525, 510–512; 361/42
See application file for complete search history.

(56) References Cited

U.S. PATENT DOCUMENTS 4,295,175 A * 10/1981 Cordray ........................ 361/69
5,963,404 A * 10/1999 Guzman-Casillas et al. .. 361/35
6,377,055 B1 * 4/2002 Macbeth et al. ............. 324/522
6,442,010 B1 * 8/2002 Kasztenny et al. ........... 361/63
6,525,543 B1 * 2/2003 Roberts et al. .............. 324/522
6,590,397 B1 * 7/2003 Roberts ....................... 324/521

FOREIGN PATENT DOCUMENTS

| DE | 3842920 A | 7/1989 |
| DE | 3842920 A1 | 7/1989 |
| DE | 196 33 856 C1 | 8/1997 |
| SU | 1149344 A | 4/1985 |
| SU | 1149344 A | 4/1985 |

OTHER PUBLICATIONS

7SA522 Manual; C53000-G1176-C155-2; p. 6-28-6-30.

* cited by examiner

Primary Examiner—Anjan Deb
Assistant Examiner—Amy He
(74) Attorney, Agent, or Firm—Baker Botts L.L.P.

(57) ABSTRACT

A method and apparatus for producing a fault signal are disclosed which indicate a short to ground on a polyphase power transmission line, in which, the phase currents on the power transmission line are detected by means of current transformers in order to form a sum current measured value. Furthermore, a first short to ground suspicion signal is produced if the sum current measured value is greater than a predetermined current threshold value, the phase voltages on the power transmission line are detected in order to form a residual voltage measured value, and a second short to ground suspicion signal is produced if the residual voltage measured value is greater than a predetermined voltage threshold value, and a fault signal which indicates a short to ground is produced if at least one short to ground suspicion signal is present.

7 Claims, 4 Drawing Sheets

METHOD FOR PRODUCING A FAULT SIGNAL WHICH INDICATES A SHORT TO GROUND

PRIORITY

This application claims foreign priority of the German application DE 10251001.6 filed on Oct. 30, 2002.

BACKGROUND OF THE INVENTION

Protective devices which operate, inter alia, on the distance protection principle are used for monitoring polyphase power transmission lines for faults that occur, in particular shorts. In this case, the impedance of loops which are created by the short is determined, and this impedance is used to deduce the distance between the fault location and the measurement point. When analyzing loops such as these, a distinction must essentially be drawn between two loop types, a conductor to ground loop and a conductor to conductor loop. In the case of a conductor to ground loop, the short produces a connection between at least one of the phase conductors and ground, while in the case of a conductor to conductor loop, at least two conductors are shorted to one another without any contact with ground. Different methods are used to determine the relevant line section in the two situations. Thus, before the calculation, it is necessary to determine whether the short does or does not involve ground (short to ground).

It is known, for example, from the manual for the Siemens 7SA522 protective device, Order Number C53000-G1100-C155-2, pages 6-28 to 6-30, for earth fault identification to be carried out on the basis of sum current and residual voltage measurements for this purpose. In the known method, a fault signal which identifies a short to ground is produced when the sum current or the residual voltage is greater than a respectively predetermined threshold value (OR linking) This makes use of the effect that both a measurable sum current and a significant residual voltage normally occur only in the case of shorts to ground, but not in the case of shorts that do not involve any ground contact.

The invention relates to a method such as this and, thus, relates in particular to a method for producing a fault signal which indicates a short to ground on a polyphase power transmission line, in the case of which, once a short has occurred on the power transmission line, the phase currents in the power transmission line are detected by means of current transformers in order to form a sum current measured value, and a first short to ground suspicion signal is produced when the sum current measured value is greater than a predetermined current threshold value, the phase voltages on the power transmission line are detected in order to form a residual voltage measured value, and a second short to ground suspicion signal is produced when the residual voltage measured value is greater than a predetermined voltage threshold value, and a fault signal which indicates a short to ground is produced when at least one short to ground suspicion signal is present.

However, if at least one current transformer which is involved in the process of determining the sum current enters saturation, then the measured values are no longer detected correctly and it is possible to determine a sum current which spuriously indicates a discrepancy from zero. Using the threshold value method described above, a short to ground would then be identified, and the instruments for determining the relevant line section in the event of a short to ground would be (undesirably) enabled. This could lead to spurious tripping of a circuit breaker connected to the protective device.

In order to prevent this, so-called stabilized ground current detection and zero current/negative phase sequence system current comparison are carried out in the known device. Since the probability of the occurrence of current transformer saturation increases as the phase currents rise, the threshold value for identification of a short to ground likewise rises as the phase currents increase for stabilized ground current detection. However, in order to ensure sufficient sensitivity, the gradient of the response characteristic must be kept relatively low. In addition to the sum current, the negative phase sequence current on the power transmission line is determined for the zero current/negative phase sequence system current comparison, and a value pair is formed from these two currents. A short to ground is or is not identified depending on the locus of the value pair in a sum current/negative phase sequence current diagram.

A further known option for improving the identification of short to ground is to connect the outputs of the threshold value stages for the sum current and for the residual voltage to an AND gate (instead of to an OR gate as described above) so that a short to ground is identified only when both the sum current and the residual voltage are greater than the predetermined threshold values. However, this AND linking reduces the sensitivity of the overall method, since the residual voltage will not invariably rise above the predetermined threshold value in every situation in which a short to ground occurs.

SUMMARY OF THE INVENTION

The invention is based on the object of further developing a method of the type mentioned initially such that spurious tripping resulting from transformer saturation is particularly effectively prevented.

According to the invention and against the background of the known method, this object can be achieved in that the current transformers are checked for transformer saturation, and if transformer saturation is present in at least one current transformer, a fault signal F which indicates a short to ground is produced when at least the second short to ground suspicion signal is present. In this case, current transformer saturation may be identified, for example, as described in German Patent Specification DE 196 33 856 C1, which is hereby incorporated by reference. The main advantage of the method according to the invention is that spurious tripping of circuit breakers resulting from a sum current measured value being corrupted by transformer saturation is effectively prevented. This is because a fault signal which identifies a short to ground is produced only when the residual voltage is greater than the predetermined voltage threshold value.

One advantageous development of the method according to the invention provides for the current threshold value to be set as a function of the maximum phase current in the power transmission line. This actually makes it possible to automatically match the threshold value to the phase current in the situation where no transformer saturation is present.

A further advantageous embodiment of the invention provides for a negative phase sequence system current measured value also to be formed from the phase currents and for a further short to ground suspicion signal to be produced when a value pair which is formed from the sum current measured value and the negative phase sequence system current measured value is within a predetermined tripping range. This allows the sensitivity of the method according to the invention to be improved further, particularly for the situation without transformer saturation.

The invention also relates to an arrangement for producing a fault signal which indicates a short to ground on a polyphase power transmission line, which arrangement has at least one current transformer for detecting the sum current in the phase conductors of the power transmission line, a current threshold value stage which is connected on the input side to the at least one current transformer, at least one current transformer for detecting the residual voltage of the phase conductors of the power transmission line, a voltage threshold value stage which is connected on the input side to the at least one voltage transformer, and an evaluation device which produces a fault signal which indicates a short to ground, when the sum current is greater than the current threshold value or the residual voltage is greater than the voltage threshold value.

In order to prevent spurious tripping as a result of current transformer saturation even more reliably in an arrangement such as this, provision is made in an arrangement of said type according to the invention for a saturation identification device also to be connected to the current transformers, which emits a saturation signal when current transformer saturation is present, and the evaluation device is connected to one output of the saturation identification device and, when a saturation signal is present, emits the fault signal (which indicates a short to ground) on the output side only when the residual voltage is greater than the voltage threshold value.

This advantageously prevents any decision being made on the basis of current detection that is subject to interference from transformer saturation.

The saturation identification device, which, for example can be designed as described in German Patent DE 196 33 856 C1, in this case produces a signal whose occurrence allows a short to ground to be identified only when the residual voltage is greater than the predetermined threshold value.

BRIEF DESCRIPTION OF THE DRAWINGS

In order to explain the invention further.

DETAILED DESCRIPTION OF THE PREFERRED EMBODIMENTS

Figure 1:
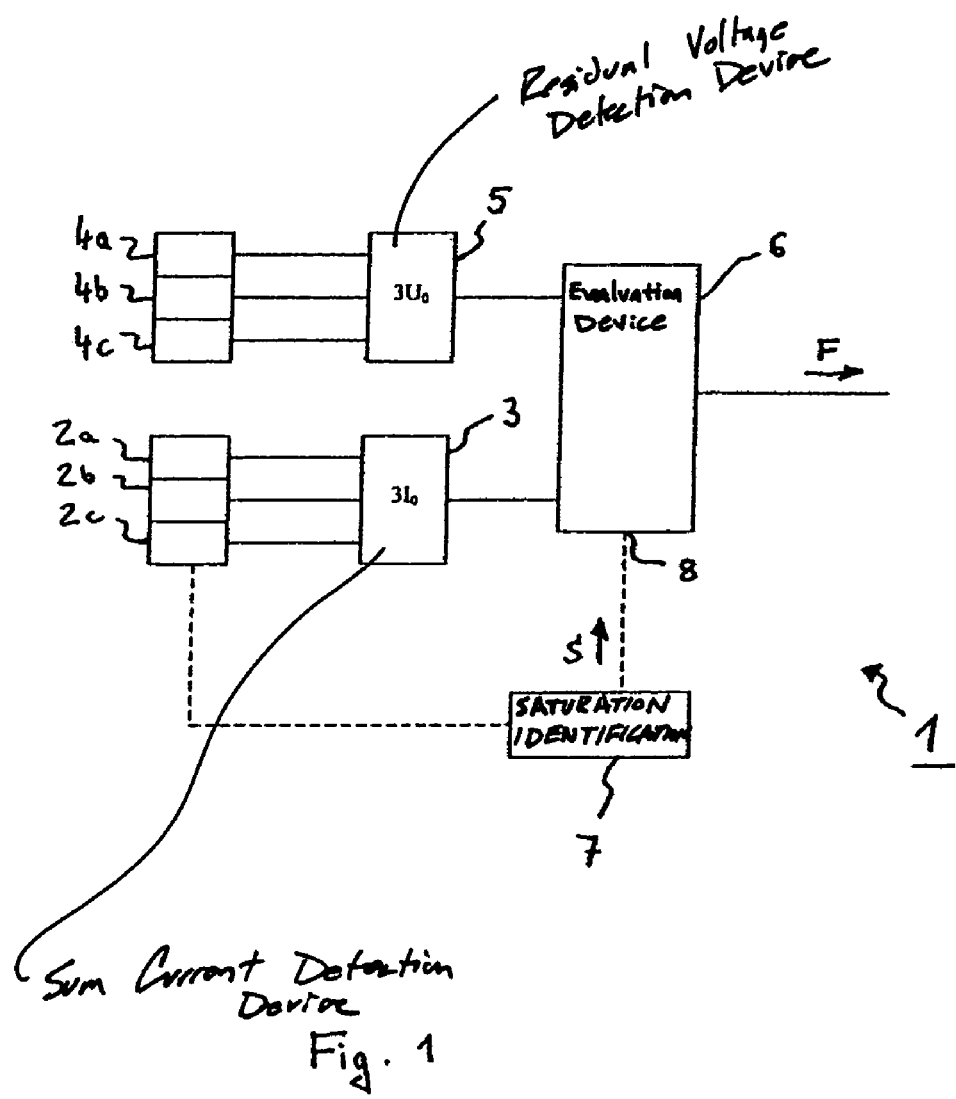
FIG. 1 shows a schematic block diagram of an arrangement for carrying out the method according to the invention.

FIG. 1 shows an arrangement 1 for producing a fault signal F which indicates a short to ground. A sum current detection device 3 is connected to a power transmission line (which is not shown in the figure) via current transformers 2a, 2b, 2c and a residual voltage detection device 5 is connected to the power transmission line via voltage transformers 4a, 4b, 4c. The number of current transformers 2a, 2b, 2c and of voltage transformers 4a, 4b, 4c in this case corresponds to the number of phase conductors in the power transmission line. Within the scope of the invention, it is also possible to provide in each case one transformer for the direct detection of the sum current or residual voltage instead of the number of current and voltage transformers, for example, a wrap-around transformer for sum current detection. However, an arrangement with a number of current and voltage transformers as shown in FIG. 1 will be considered in the following text.

The current and voltage vectors which are respectively detected by the current transformers and voltage transformers are added in the sum current detection device 3 and in the residual voltage detection device 5, respectively, for a three-phase power transmission line using the following equations 1 and 2 in order to form the subcurrent $3I_0$ (equation 1) and the residual voltage $3U_0$ (equation 2), respectively:

$$3\underline{I}_0 = \underline{I}_{L1} + \underline{I}_{L2} + \underline{I}_{L3} \tag{1}$$

$$3\underline{U}_0 = \underline{U}_{L1} + \underline{U}_{L2} + \underline{U}_{L3} \tag{2}$$

In this case, the indices $L_1$, $L_2$, and $L_3$ represent the respective phase conductors. The sum current $3I_0$ and the residual voltage $3U_0$ are then passed to different inputs of an evaluation device 6. A saturation identification device 7 is also connected to the current transformers 2a, 2b, 2c for the current detection device 3. This connection is represented by a dashed line in FIG. 1; in fact, each current transformer is connected to its own saturation identification device or to a saturation identification device which is shared by all the current transformers, in each case via a separate electrical connection. The saturation identification device 7 is in turn linked on the output side to a control input 8 of the evaluation device 6. In order to identify a short to ground on the power transmission line (which is not shown in FIG. 1), the sum current $3I_0$ and the residual voltage $3U_0$ are in each case formed, using the given equations 1 and 2, from the individual phase currents and voltages respectively, by means of the sum current detection device 3 and the residual voltage detection device 5. During normal operation without transformer saturation, these two variables normally assume values close to zero. If a short now occurs on the power transmission line, the algorithm for identification of a short to ground is started. To do this, the determined sum current $3I_0$ is compared with the current threshold value, and the determined residual voltage, $3U_0$ is compared with a corresponding voltage threshold value in the evaluation device 6. If the sum current is greater than the current threshold value, then an internal short to ground suspicion signal is produced; analogously, a second short to ground suspicion signal is produced when the residual voltage is greater than the voltage threshold value. If at least one of the two short to ground suspicion signals is present, then a short to ground is identified (in the situation where no transformer saturation is present), and an appropriate fault signal F is produced at the output of the evaluation device 6.

However, after the occurrence of a short on the power transmission line, if the saturation identification device 7 identifies that at least one of the current transformers 2a, 2b, 2c is saturated, then a saturation signal S is produced at its output and is passed to the control input 8 of the evaluation device 6. The evaluation device 6 is itself set such that, when a saturation signal S is present at the control input 8, the fault signal F which indicates a short to ground is produced only when the residual voltage $3U_0$ is greater than the voltage threshold value. The sum current value $3I_0$ which is unreliable due to transformer saturation is in this case no longer included as a decision criterion in the short to ground identification process. In a situation where transformer saturation is present, the fault signal F which indicates a short to ground is produced only when a short to ground on the power transmission line is present on the basis of the residual voltage criterion.

The fault signal F which indicates a short to ground is normally used by a protective device (not shown in FIG. 1) to activate appropriate instruments for determining the relevant line section. A spuriously produced fault signal F can thus lead to undesirable activation of the instruments and possibly to undesirable tripping of a circuit breaker that is connected to the protective device. In the event of undesirable tripping of a circuit breaker, the corresponding section of the power transmission line will be disconnected from the network even though no short to ground was present there. Such spurious tripping can be prevented by the method according to the invention.

Figure 2:
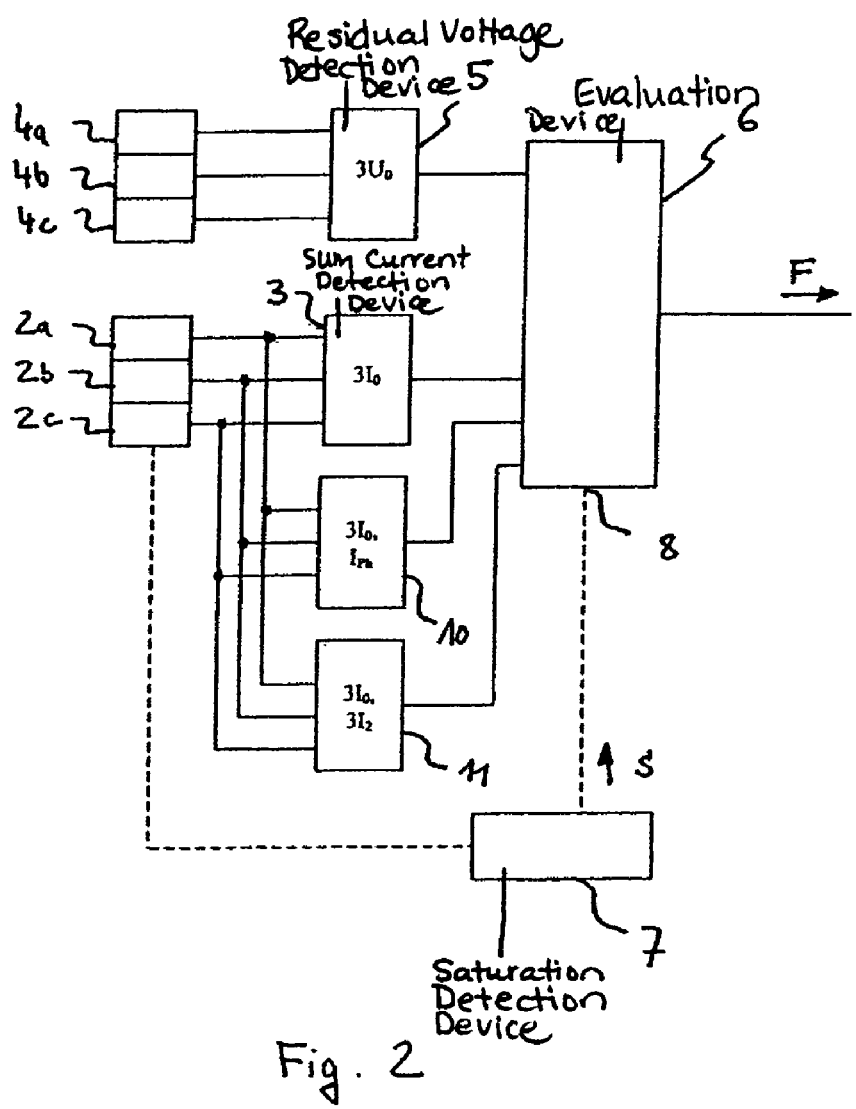
FIG. 2 shows a schematic block diagram of an arrangement for carrying out an advantageous development of the method according to the invention.

FIG. 2 shows an advantageous development of the arrangement for producing a fault signal which indicates a short to ground. Components which correspond to FIG. 1 are identified by the same reference symbols. In addition to the arrangement shown in FIG. 1, a module for stabilized sum current detection 10 and a module for sum current/negative phase sequence system current comparison 11 are shown in FIG. 2, and these modules are connected on the input side to the current transformers 2a, 2b, 2c and on the output side to the evaluation device 6.

Figure 3:
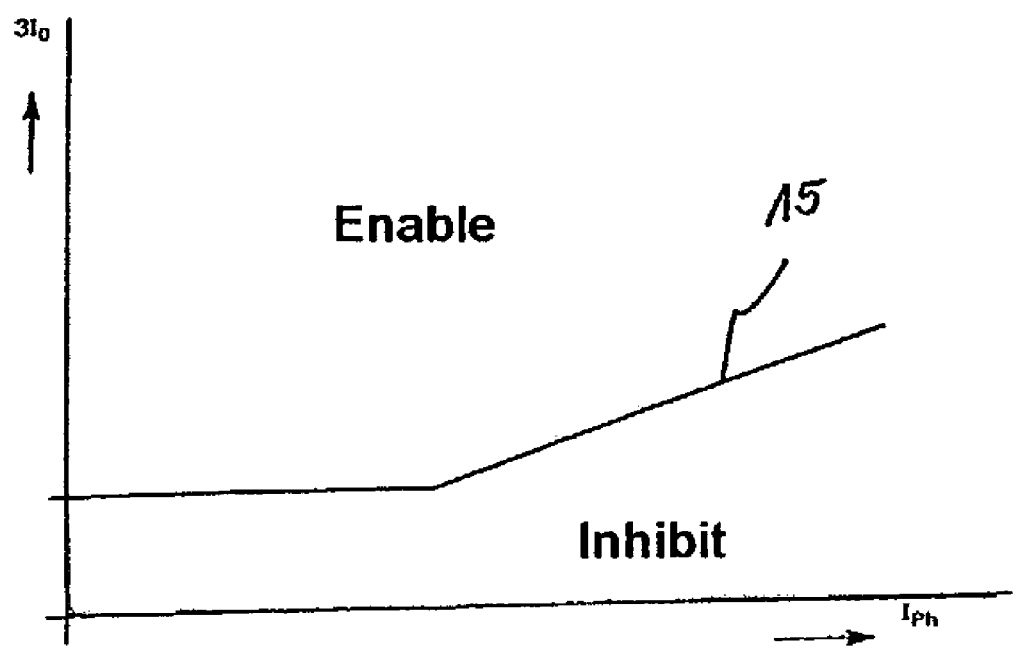
FIG. 3 shows a diagram to explain the setting of the current threshold value.

The module for stabilized sum current detection 10 allows the current threshold value with which the sum current $3I_0$ is compared to be dynamically matched to the magnitude of the maximum phase conductor current $I_{Ph}$. This is explained in more detail in FIG. 3. FIG. 3 shows a diagram in which the sum current $3I_0$ is plotted against the maximum phase conductor current $I_{Ph}$. The solid line denotes the characteristic 15 on the basis of which the respective threshold value is set for the sum current $3I_0$. As can be seen, the threshold value in each case rises for high phase currents, $I_{Ph}$, while the threshold value is constant for low phase current $I_{Ph}$. If a corresponding value pair ($3I_0$, $I_{Ph}$) is now located in the area identified by "enable" above the characteristic 15, then a short to ground is identified on the basis of the sum current criterion. If a corresponding value pair ($3I_0$, $I_{Ph}$) is located underneath the characteristic (that is to say in the area identified by "inhibit"), then a short without ground contact is identified on the basis of the sum current criterion.

Figure 4:
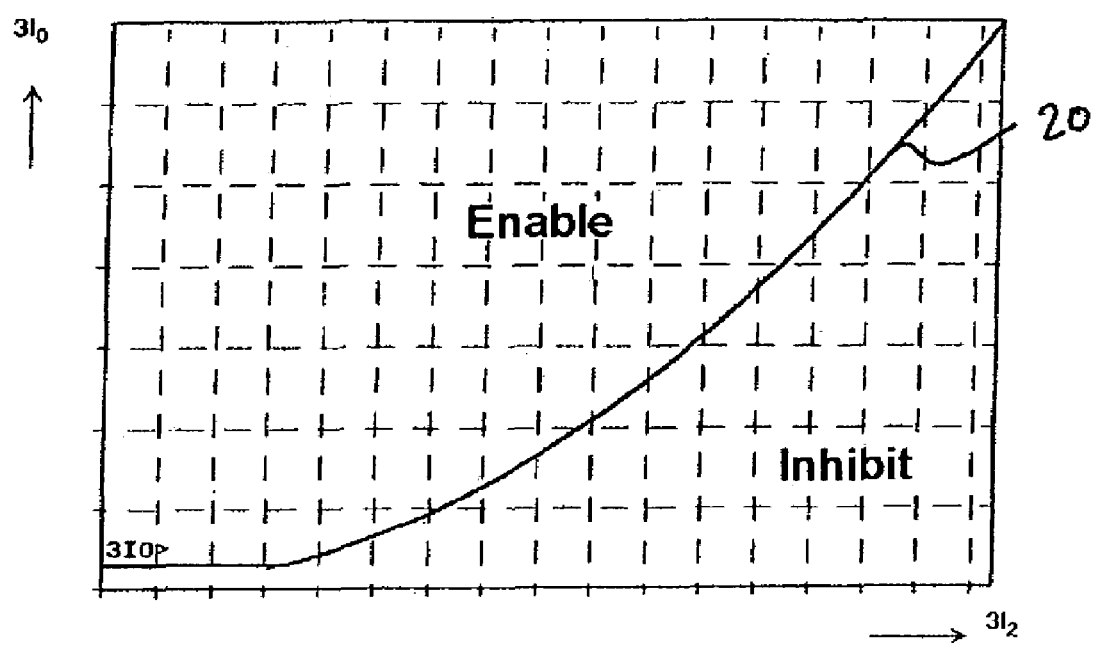
FIG. 4 shows a diagram to explain the sum current/negative phase sequence system current comparison.

The module for sum current/negative phase sequence system current comparison allows the sensitivity and reliability of the arrangement to be further improved. The method of operation is explained in the diagram illustrated in FIG. 4, where the sum current $3I_0$ is plotted against the negative phase sequence system current $3I_2$. The negative phase sequence system current $3I_2$ is in this case determined using equation 3:

$$3I_2 = I_{L1} + a^2 I_{L2} + a I_{L3} \quad (3)$$

where $a = e^{j(2\pi/3)}$. In the diagram shown in FIG. 4, a typical value range is defined for producing a further short to ground suspicion signal. If a value pair ($3I_0$, $3I_2$) occurs in this area which is identified by "enable" in FIG. 4, then the further short to ground suspicion signal is produced, but no short to ground suspicion signal is produced if it is located in the area identified by "inhibit". The two areas ("enable", "inhibit") are separated from one another by the characteristic 20.

The method of operation in the event of current transformer saturation corresponds to the method described in FIG. 1. If current transformer saturation is identified in the saturation identification device 5, then, in consequence, a fault signal F which indicates a short to ground is produced only when the residual voltage $3U_0$ is above the voltage threshold value. In this case, the sum current criterion is not used for the decision on whether the short to ground is present.

What is claimed is:

1. A method for producing a fault signal indicative of a short to ground on a polyphase power transmission line after a short occurs on the power transmission line said method comprising:
   detecting phase currents on the power transmission line using current transformers to determine a sum current measured value, and producing a first short to ground suspicion signal if the sum current measured value is greater than a predetermined current threshold value;
   detecting the phase voltages on the power transmission line to form a residual voltage measured value and producing a second short to ground suspicion signal if the residual voltage measured value is greater than a predetermined voltage threshold value;
   producing a fault signal F indicating a short to ground if at least one short to ground suspicion signal is present;
   checking the current transformers for transformer saturation; and
   if transformer saturation is present in at least one current transformer, producing the fault signal F which indicates a short to ground only when at least the second short to ground suspicion signal is present.

2. The method as claimed in claim 1, further comprising setting the current threshold value as a function of the maximum phase current in the power transmission line.

3. The method as claimed in claim 1, further comprising:
   forming a negative phase sequence system current measured value from the phase currents;
   producing a further short to ground suspicion signal when a value pair, formed from the sum current measured value and the negative phase sequence system current measured value, is within a predetermined tripping range.

4. A method for producing a fault signal which indicates a short to ground on a polyphase power transmission line said method, comprising:
   detecting the phase currents on the power transmission line by means of current transformers in order to form a sum current measured value, and generating a first short to ground suspicion signal if the sum current measured value is greater than a predetermined current threshold value;
   detecting the phase voltages on the power transmission line in order to form a residual voltage measured value, and generating a second short to ground suspicion signal if the residual voltage measured value is greater than a predetermined voltage threshold value;
   generating a fault signal indicative of a short to ground produced if at least one short to ground suspicion signal is present;
   checking the current transformers for transformer saturation; and
   generating a fault signal F indicative of a short to ground produced only when at least the second short to ground suspicion signal is present, if transformer saturation is present in at least one current transformer.

5. The method as claimed in claim 4, wherein the current threshold value is set as a function of the maximum phase current in the power transmission line.

6. The method as claimed in claim 4, wherein:
   a negative phase sequence system current measured value is formed from the phase currents; and a further short to ground suspicion signal is produced when a value pair which is formed from the sum current measured value and the negative phase sequence system current measured value is within a predetermined tripping range.

7. An arrangement for producing a fault signal which indicates a short to ground on a polyphase power transmission line, said arrangement comprising:

- at least one current transformer for detecting the sum current in the phase conductors of the power transmission line;
- a current threshold value stage connected on the input side to the at least one current transformer;
- at least one current transformer for detecting the residual voltage of the phase conductors of the power transmission line;
- a voltage threshold value stage connected on the input side to the at least one voltage transformer;
- an evaluation device producing a fault signal indicative of a short to ground greater than the current threshold value or the residual voltage is greater than the voltage threshold value;
- a saturation identification device connected to the at least one current transformer and emits a saturation signal when current transformer saturation is present; wherein
- the evaluation device is connected to one output of the saturation identification device and, when the saturation signal is present, emits a fault signal on the output side only when the residual voltage is greater than the voltage threshold value.

* * * * *